United States Patent
Nam et al.

(10) Patent No.: US 8,179,146 B2
(45) Date of Patent: May 15, 2012

(54) PARTIAL DISCHARGE DETECTION SENSOR AND PARTIAL DISCHARGE DETECTION DEVICE USING THE SAME

(75) Inventors: Seok-Hyun Nam, Gumi-si (KR); Choong-Sik Kim, Anyang-si (KR); Jung-Min Lee, Ansan-si (KR); Young-Hong Kim, Anyang-si (KR)

(73) Assignee: LS Cable & System Ltd., Anyang-si, Gyeonggi-do (KR)

( * ) Notice: Subject to any disclaimer, the term of this patent is extended or adjusted under 35 U.S.C. 154(b) by 425 days.

(21) Appl. No.: 12/500,365

(22) Filed: Jul. 9, 2009

(65) Prior Publication Data
US 2010/0194403 A1 Aug. 5, 2010

(51) Int. Cl.
*G01R 31/02* (2006.01)
(52) U.S. Cl. .......................... 324/536; 324/551
(58) Field of Classification Search .......... 324/464, 324/465, 122, 536, 551; 343/701
See application file for complete search history.

(56) References Cited

U.S. PATENT DOCUMENTS

| | | | |
|---|---|---|---|
| 2002/0024467 A1* | 2/2002 | Kato et al. | 343/701 |
| 2005/0285604 A1* | 12/2005 | Shinohara et al. | 324/557 |

* cited by examiner

*Primary Examiner* — Vincent Q Nguyen
(74) *Attorney, Agent, or Firm* — Sherr & Vaughn, PLLC

(57) ABSTRACT

A partial discharge detection sensor is used for detecting a partial discharge signal in a gas-insulated equipment using a PCB substrate, and a partial discharge detection device employs the partial discharge detection sensor. The partial discharge detection sensor includes a PCB substrate, a partial discharge signal detection pattern formed on the PCB substrate to detect a partial discharge signal in the gas-insulated equipment, and a connection terminal for receiving the partial discharge signal detected by the partial discharge signal detection pattern and transmitting the partial discharge signal to a connector that emits the partial discharge signal to the outside. The partial discharge detection sensor is attached to an inner wall of an enclosure of the gas-insulated equipment.

11 Claims, 5 Drawing Sheets

PARTIAL DISCHARGE DETECTION SENSOR AND PARTIAL DISCHARGE DETECTION DEVICE USING THE SAME

CROSS-REFERENCE TO RELATED APPLICATION

This application claims priority to Korean Patent Application No. 10-2009-0009240, filed on Feb. 5, 2009, and all the benefits accruing therefrom under 35 U.S.C. §119, the contents of which in its entirety are herein incorporated by reference.

BACKGROUND

1. Field

This disclosure relates to a partial discharge detection sensor and a partial discharge detection device using the same, and more particularly to a partial discharge detection sensor which is located in a gas-insulated device to detect a partial discharge signal occurring in the gas-insulated device, and a partial discharge detection device using the same.

2. Description of the Related Art

Power equipments such as gas-insulated power transmission lines, gas-insulated switches, gas-insulated transformers, gas-insulated buses and bus ducts are gas-insulated equipments configured such that an insulating gas is filled in a grounded enclosure and also a conductor is insulated by a solid insulator and supported in the enclosure.

In the gas-insulated equipment, partial discharge may occur due such factors such as impurities existing in the gas-insulated equipment, internal defects like scratches or projections of the inner side of the enclosure or the inner conductor, or inaccurate assembly.

The partial discharge has a great influence on the performance of the gas-insulated equipment, which may cause a catastrophic accident if left alone. Thus, there is a need of a device for finding out a partial discharge early by measuring and detecting the partial discharge by a signal of an electromagnetic form such that a countermeasure can be taken rapidly.

As one of existing devices and methods for detecting a partial discharge in a gas-insulated equipment, there is a device and method for detecting a partial discharge using an external sensor installed at an outside of the gas-insulated equipment.

FIG. 1A is a plan view showing the concept of the device and method for measuring a partial discharge by installing an external sensor at an outside of a gas-insulated equipment, and FIG. 1B is a sectional view showing the device of FIG. 1A.

As shown in FIG. 1A, the external sensor 11 is installed at an outside of an enclosure 20 that constitutes a gas-insulated equipment 1. In this method, a partial discharge signal transmitted through a spacer 21 that fixes and supports an inner conductor in the enclosure is detected. Referring to FIGS. 1A and 1B, a sensor box 10 made of a metal plate is installed at a shielding metal band 22 that shields and surrounds the spacer 21, and a sensor 11 is installed therein. A partial discharge signal occurring due to internal defects such as projections 41 is transmitted to the sensor passing through a dielectric substance that constitutes the spacer 21.

However, the partial discharge detection device using such an external sensor 11 has low sensitivity, and particularly it is seriously influenced by external noise.

To solve this problem, there is proposed a method in which a sensor is installed inside the gas-insulated equipment. In this method, ultra high frequency (UHF) sensors are frequently used.

FIG. 2 is a schematic view showing the concept of the device and method for measuring a partial discharge by installing a UHF sensor in the enclosure of a gas-insulated equipment.

As shown in FIG. 2, the UHF sensor 10 is generally installed inside a disk 50, frequently called a monitoring window, to detect a partial discharge signal occurring in the gas-insulated equipment 1. Generally, the UHF sensor 10 used in such a device is formed by disposing a conductor line on the disk 50 and then pouring epoxy or the like thereto. Thus, it is difficult to make the UHF sensor 10 into various shapes, so the UHF sensor 10 may not be easily produced to have a broadband detection characteristic. Thus, in general, the UHF sensor 10 for detecting a partial discharge signal has ultra high frequency band in the level of several GHz.

Among partial discharge signals occurring in the gas-insulated equipment, partial discharge signals occurring at long distances include all signals from low frequency band to ultra high frequency band. However, a signal in the level of ultra high frequency band (several GHz) is attenuated rapidly during transmission, although it has a great intensity when it is generated, while signals in high or low frequency bands are relatively less attenuated. In other words, it is required to use a sensor having a broadband characteristic in order to effectively detect partial discharge signals occurring from the inside of the gas-insulated equipment.

Although the device and method for measuring a partial discharge by installing a UHF sensor in the enclosure of a gas-insulated equipment may decrease noise occurring out of the gas-insulated equipment, the UHF sensor generally has a ultra high frequency band as mentioned above. Thus, this device and method exhibits bad sensitivity when receiving and detecting a partial discharge signal occurring at a long distance.

SUMMARY

In order to solve the above problems, this disclosure is directed to providing a partial discharge detection sensor which may be easily manufactured while ensuring a broadband characteristic since a partial discharge signal detection pattern for detecting a partial discharge signal in a gas-insulated equipment is formed on a printed circuit board (PCB) substrate, and a partial discharge detection device using the same.

Also, this disclosure is directed to providing a partial discharge detection sensor which may be easily fixed in a gas-insulated equipment and less influenced by external noise, and a partial discharge detection device using the same.

In one aspect, there is provided a partial discharge detection sensor that includes a PCB substrate, a partial discharge signal detection pattern formed on the PCB substrate to detect a partial discharge signal in a gas-insulated equipment, and a connection terminal for receiving the partial discharge signal detected by the partial discharge signal detection pattern and transmitting the partial discharge signal to a connector that emits the partial discharge signal to the outside.

Also, the partial discharge detection sensor may further include a fixing unit for fixing the PCB substrate.

Also, the PCB substrate may have a capacitance of 1 to 100 pF.

Also, the partial discharge detection sensor may have a frequency band of 10 MHz to 1 GHz.

Also, the PCB substrate may have a plate shape.

In another aspect, there is also provided a partial discharge detection device for detecting a partial discharge in a gas-insulated equipment, the device including an enclosure, an inner conductor located in the enclosure and an insulating gas for insulating the enclosure and the inner conductor from each other, the device also including the above partial discharge detection sensor and a connector connected to the connection terminal of the partial discharge detection sensor to receive the partial discharge signal detected by the partial discharge detection sensor and emit the partial discharge signal to the outside, wherein the partial discharge detection sensor is located in the enclosure.

Also, the partial discharge detection sensor may be attached to an inner wall of the enclosure.

Also, the connector may be attached to an outer wall of the enclosure.

Also, the connector and the partial discharge detection sensor may be connected with each other via a through hole formed on the enclosure.

The partial discharge detection sensor disclosed herein may be manufactured to easily have a broadband frequency characteristic since a partial discharge signal detection pattern is formed on a PCB substrate. Thus, this sensor may detect even the partial discharge signal occurring at a long distance.

Also, since the partial discharge detection sensor disclosed herein is installed in a gas-insulated equipment, it may not be influenced by external noise.

BRIEF DESCRIPTION OF THE DRAWINGS

The above and other aspects, features and advantages of the disclosed exemplary embodiments will be more apparent from the following detailed description taken in conjunction with the accompanying drawings in which.

DETAILED DESCRIPTION

Figure 1A:
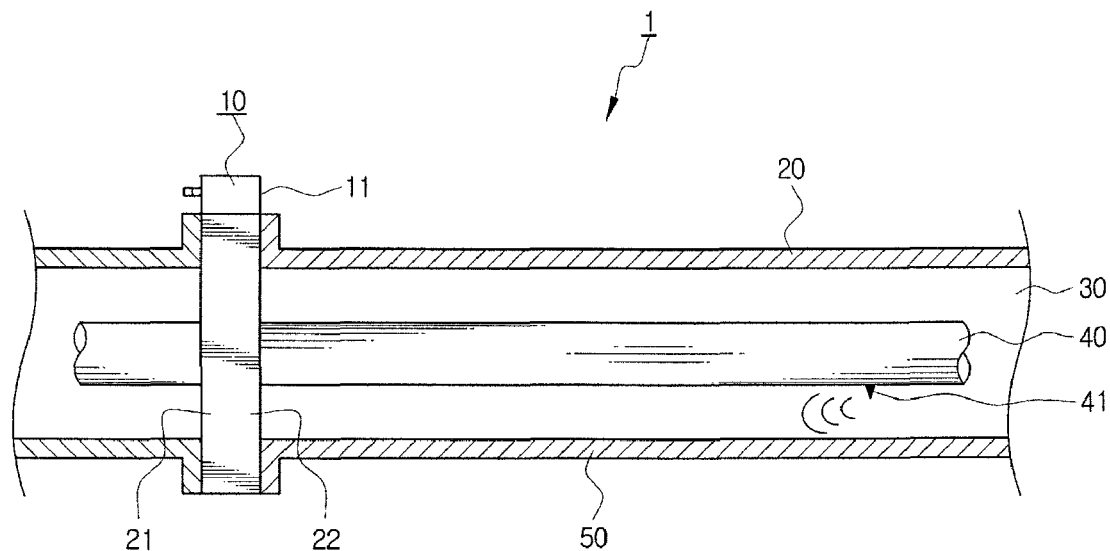
FIG. 1A is a plan view showing the concept of a device and method for measuring a partial discharge by installing an external sensor at an outside of a gas-insulated equipment.
Figure 1B:
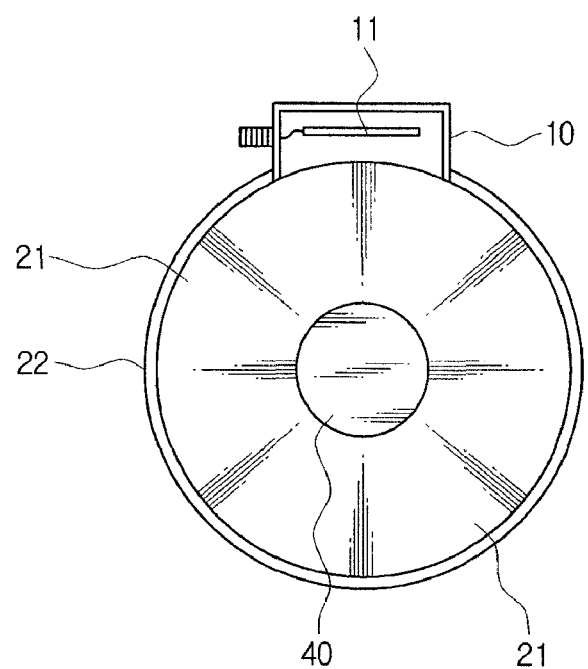
FIG. 1B is a sectional view showing the device of FIG. 1A.

Exemplary embodiments now will be described more fully hereinafter with reference to the accompanying drawings, in which exemplary embodiments are shown. This disclosure may, however, be embodied in many different forms and should not be construed as limited to the exemplary embodiments set forth therein. Rather, these exemplary embodiments are provided so that this disclosure will be thorough and complete, and will fully convey the scope of this disclosure to those skilled in the art. In the description, details of well-known features and techniques may be omitted to avoid unnecessarily obscuring the presented embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements. The shape, size and regions, and the like, of the drawing may be exaggerated for clarity.

Figure 3:
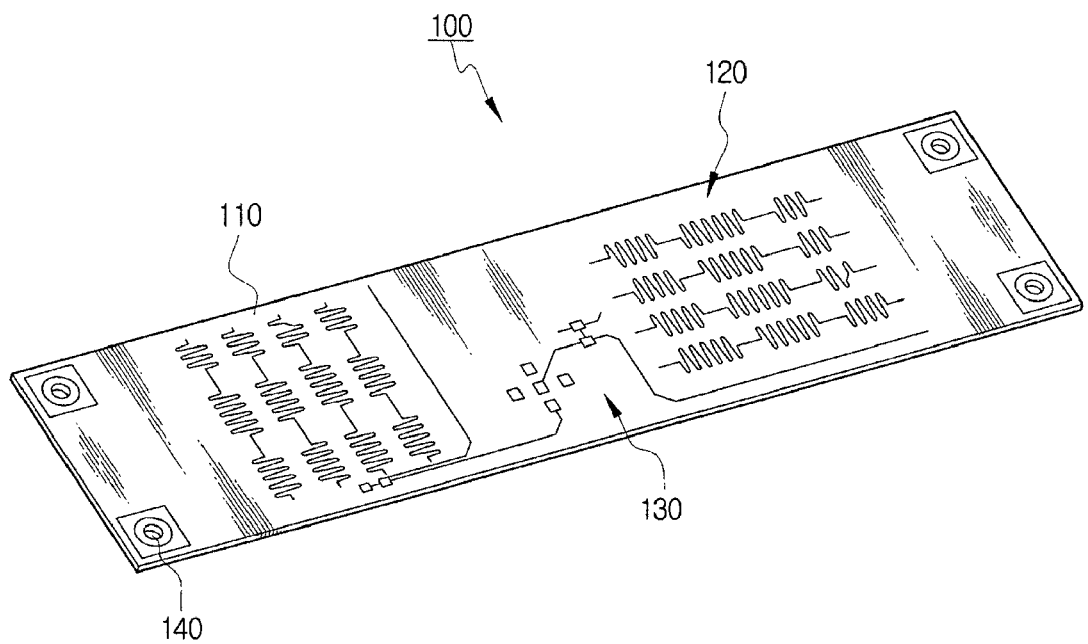
FIG. 3 is a schematic perspective view showing a partial discharge detection sensor 100 according to one embodiment.

FIG. 3 is a schematic perspective view showing a partial discharge detection sensor 100 according to one embodiment.

As shown in FIG. 3, a partial discharge signal detection pattern 120 for detecting a partial the partial discharge detection sensor 100 of this embodiment is formed on a printed circuit board (PCB) substrate 110 having a plate shape, thereby configuring the partial discharge detection sensor 100 of this embodiment.

Since the PCB substrate 110 is formed with a plate shape, the entire height of the partial discharge detection sensor 100 is decreased. If the height of the partial discharge detection sensor 100 is decreased, no problem is caused on insulation characteristics of a gas-insulated equipment even when the partial discharge detection sensor 100 is attached directly to an inner wall of the enclosure of the gas-insulated equipment, as will be explained in detail later.

Capacitance according to the insulating characteristic of the PCB substrate 110 plays a role of coupling a partial discharge signal occurring in the gas-insulated equipment. The partial discharge signal occurring in the gas-insulated equipment includes all signals from low frequency band to ultra high frequency band, so the partial discharge detection sensor 100 has excellent sensitivity when the PCB substrate 110 has capacitance of 1 to 100 pF.

A pattern exhibiting a circuit characteristic may be easily formed on the PCB substrate 110. Thus, a partial discharge signal detection pattern 120 for detecting partial discharge may be very easily formed thereon as compared to UHF sensors, so the pattern may be formed in various shapes. The partial discharge signal detection pattern 120 may be realized in various shapes such as coil-like, circular, spiral and polygonal shapes, and the sensor may have different sensitivity characteristics depending on the shapes.

The partial discharge detection sensor 100 of this embodiment is configured by forming the partial discharge signal detection pattern 120 on the PCB substrate 110. Thus, differently from UHF sensors that hardly realize broadband characteristics, the partial discharge detection sensor 100 may be easily configured to ensure broadband characteristics of several MHz to several GHz. The partial discharge detection sensor 100 may have frequency characteristics of 10 MHz to 1 GHz considering the frequency characteristics of the partial discharge signals in the gas-insulated equipment.

FIGS. 4A, 4B, 5A and 5B are graphs illustrating partial discharge signals in a gas-insulated equipment, detected using an existing UHF sensor and the partial discharge detection sensor 100 of this embodiment.

Figure 4A:
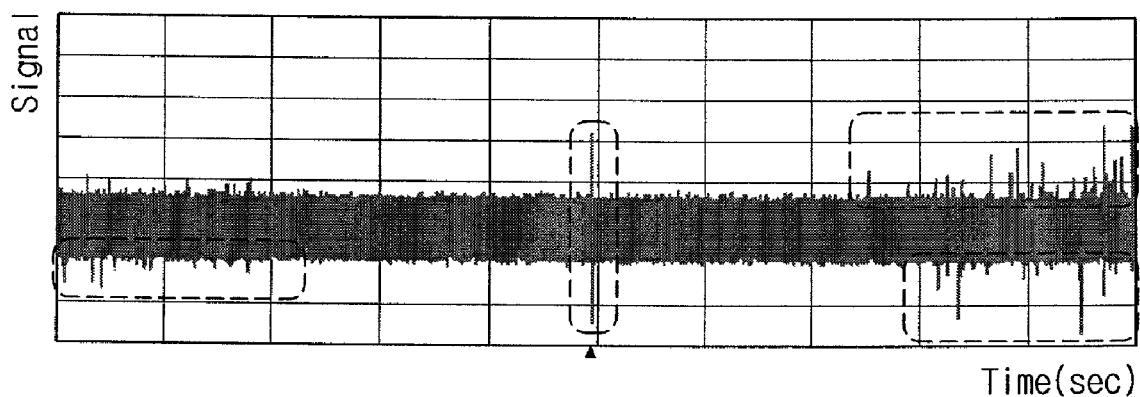
FIGS. 4A, 4B, 5A and 5B are graphs illustrating partial discharge signals in a gas-insulated equipment, detected using the UHF sensor of FIG. 2 and the partial discharge detection sensor 100 of the above embodiment.
Figure 4B:
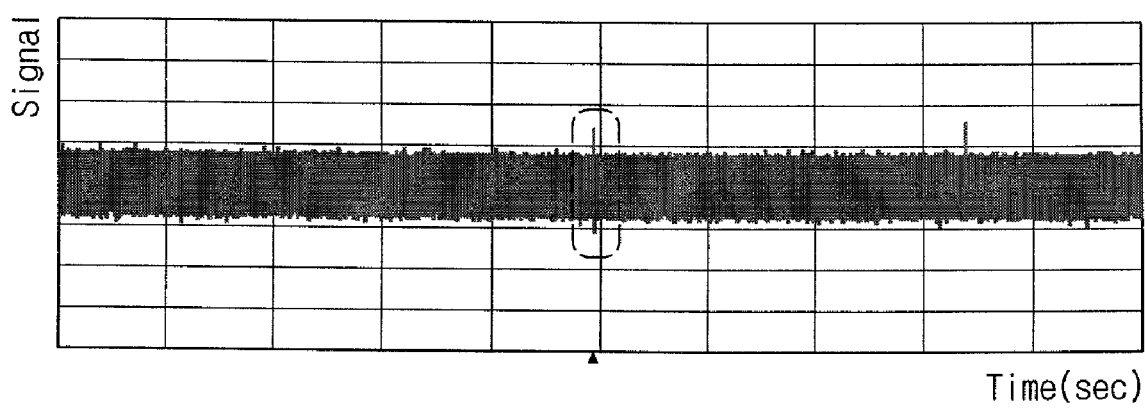
Figure 5A:
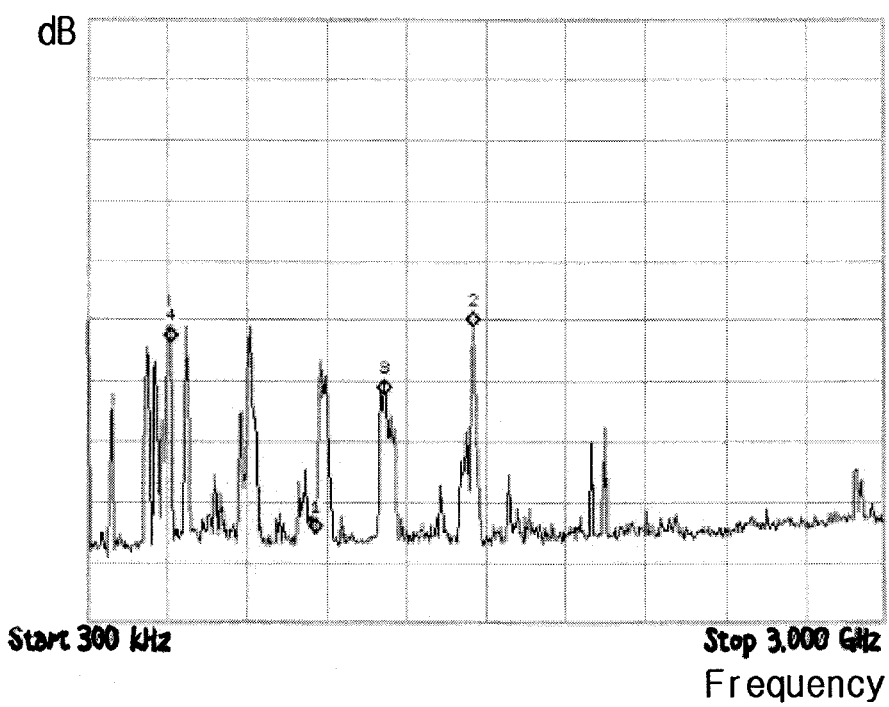

In FIGS. 4A, and 5A, the graphs illustrate partial discharge signals in a gas-insulated equipment, detected by the partial discharge detection sensor 100 according to this embodiment. Meanwhile, In FIGS. 4B and 5B, the graphs illustrate partial discharge signals in a gas-insulated equipment, detected by an existing UHF sensor. The UHF sensor is installed in the enclosure of the gas-insulated equipment.

FIGS. 4A and 4B are graphs showing partial discharge signals detected at each time point within a certain period. As indicated by the dotted line at the center of the graph in FIG. 4A and the graph in FIG. 4B, it would be understood that the partial discharge detection sensor 100 of this embodiment detects 2 or 3 times greater signals than the UHF sensor. Also, it can be found out that partial discharge signals not detected in the graph in FIG. 4B are detected in the graph the graph in FIG. 4A. In other words, the partial discharge detection sensor 100 of this embodiment allows sensing with higher sensitivity than the existing UHF sensor.

Figure 5B:
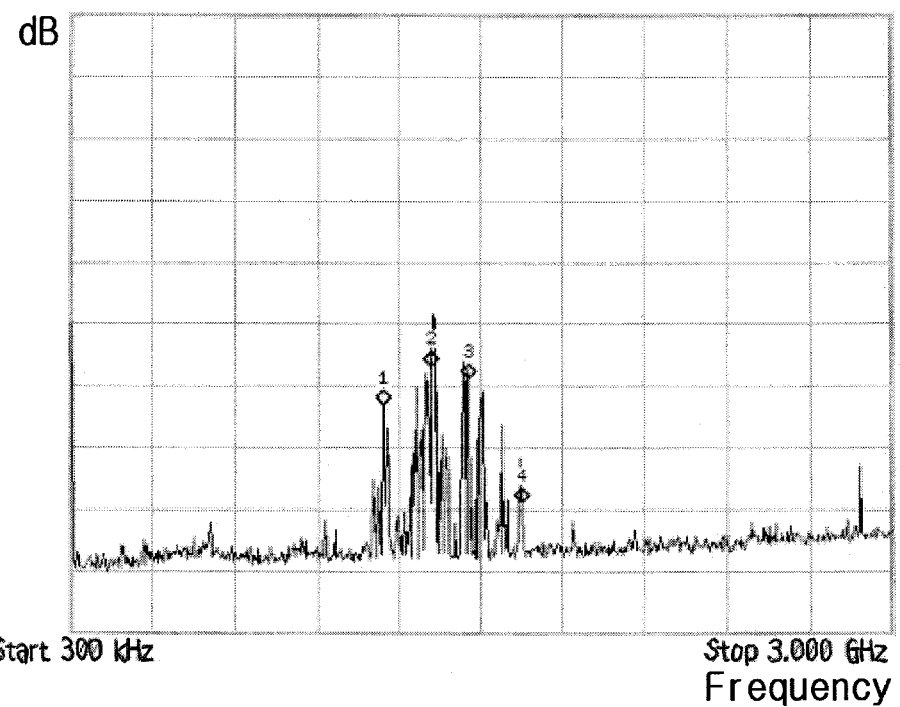

FIGS. 5A and 5B are graphs showing partial discharge signals detected in the frequency domain. The partial discharge detection sensor 100 of this embodiment may be manufactured to have a broadband frequency response characteristic in an easy way rather than the existing UHF sensor. Thus, as shown in FIG. 5A, partial discharge signals may be detected over a broad band. In other words, the partial discharge detection sensor 100 of this embodiment has better response characteristics not only in an ultra high frequency band but also in a high frequency band in comparison to the existing UHF sensor. So, the partial discharge detection sensor 100 of this embodiment allows detection of partial discharge signals occurring at a long distance.

Referring again to FIG. 3, the partial discharge detection sensor 100 of this embodiment includes a connection terminal 130, and the connection terminal 130 may be connected to a connector that emits the partial discharge signal detected in the partial discharge signal detection pattern 120 to the outside. The connection will be explained in detail later. Also, the partial discharge detection sensor 100 includes a fixing unit 140 for facilitating attachment to the gas-insulated equipment. As shown in FIG. 3, the fixing unit 140 is configured as a through hole, so that the partial discharge detection sensor 100 may be fixed thereto using a bolt or the like, but, not limited to thereto. Alternatively, the fixing unit 140 may have an adhesive portion so that the sensor may be adhered to an appropriate location. In other words, the fixing unit 140 may adopt any configuration that allows easy attachment of the partial discharge detection sensor 100 to the gas-insulated equipment.

Figure 6:
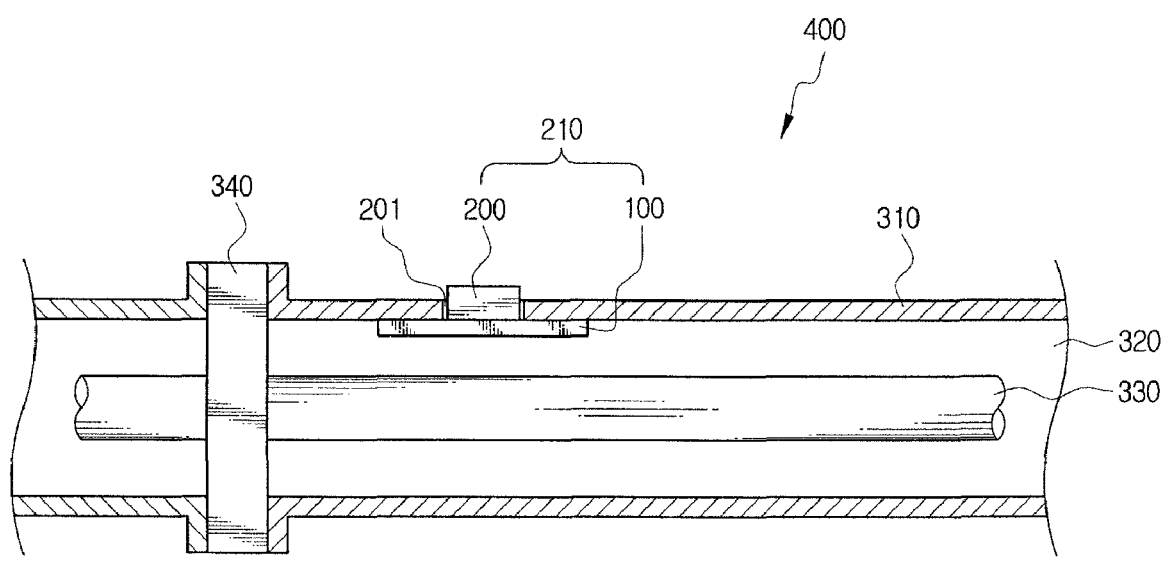
FIG. 6 is a schematic partial sectional view showing a gas-insulated equipment 400 on which a partial discharge detection device 210 according to one embodiment is installed.

FIG. 6 is a schematic partial sectional view showing a gas-insulated equipment 400 on which a partial discharge detection device 210 according to one embodiment is installed. As shown in FIG. 6, the partial discharge detection device 210 includes a partial discharge detection sensor 100 and a connector 200.

The partial discharge detection sensor 100 employed in the partial discharge detection device 210 is already explained above, and will not be described in detail again. In this embodiment, the partial discharge detection sensor 100 is installed at an inner side of an enclosure 310 that configures the gas-insulated equipment 400. Since the partial discharge detection sensor 100 is installed inside of the enclosure 310, the influence of external noise on the partial discharge detection sensor 100 is minimized.

Figure 2:
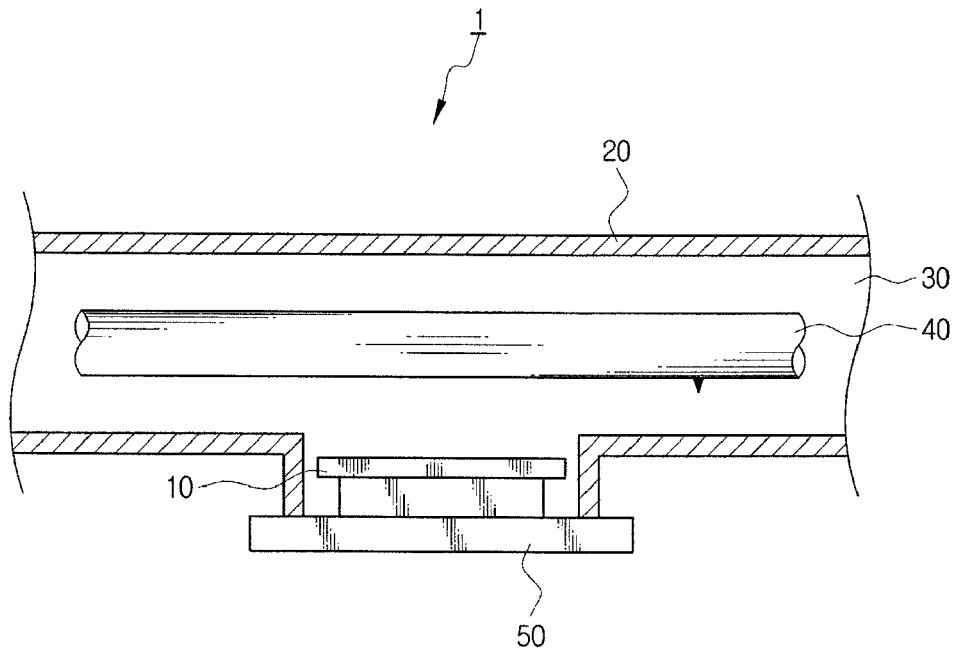
FIG. 2 is a schematic view showing the concept of a device and method for measuring a partial discharge by installing a UHF sensor in an enclosure of a gas-insulated equipment.

The partial discharge detection sensor 100 may be installed at the inside of the enclosure 310 by forming a through hole in the enclosure 310, as shown in FIG. 2. That is, a monitoring window may be installed as in an existing case to install the partial discharge detection sensor 100. Also, an additional structure may be installed in a space between the enclosure 310 and an inner conductor 330, namely in a space where an insulating gas 320 is filled, for installation of the partial discharge detection sensor 100.

Because the partial discharge detection sensor 100 has a small height, the partial discharge detection sensor 100 does not cause any serious problem in the insulating characteristics of the gas-insulated equipment 400 even when the partial discharge detection sensor 100 is directly attached to the inner wall of the enclosure 310 without forming the monitoring window. Also, if an additional structure is used to install the partial discharge detection sensor 100 to the inner side of the enclosure 310, the partial discharge detection device may have complicated configuration and cause problems in the insulating characteristics of the gas-insulated equipment 400. Thus, as shown in FIG. 6, the partial discharge detection sensor 100 of this embodiment is directly attached to the inner wall of the enclosure 310. In this case, if the fixing unit 140 (see FIG. 3) is formed in the partial discharge detection sensor 100, the partial discharge detection sensor 100 is attached to the inner wall of the enclosure 310 by means of the fixing unit 140.

If the partial discharge detection sensor 100 is directly installed at the inner wall of the enclosure as mentioned above, there is no need to fabricate an enclosure having a through hole for installation of the partial discharge detection sensor (for example, a through hole for forming the monitoring window). Thus, the cost for fabricating the enclosure may be reduced, and the partial discharge detection device 210 may be simply installed at the gas-insulated equipment 400.

The partial discharge detection device 210 of this embodiment includes a connector 200 for emitting the partial discharge signal detected at the partial discharge detection sensor 100 to the outside. As shown in FIG. 6, the connector 200 is fixed to an outer wall of the enclosure 310, and a small through hole 201 is formed therein, so that the connector 200 may be directly connected to the connection terminal 130 (see FIG. 3) of the partial discharge detection device 210. After the connector 200 is connected to the connection terminal 130, the gap of the through hole 201 is sealed for airtightness of the insulating gas 320. In this embodiment, the through hole 201 is simply formed in the outer wall of the enclosure 310, and the connector 200 is connected to the partial discharge detection sensor 100 through the through hole 201. Thus, the partial discharge detection device 210 may be installed easily. Since the connector 200 is installed out of the enclosure 310, the connector 200 does not give an influence on the insulating characteristics inside the gas-insulated equipment 400.

Also, since the connector 200 is directly connected to the connection terminal through the through hole formed in the enclosure 310, there is no need to install an additional apparatus in the enclosure 310 for emitting the partial discharge signal detected by the partial discharge detection sensor 100. Thus, the partial discharge detection device 210 is more simplified, and no negative influence is applied to the insulating characteristics of the gas-insulated equipment 400.

While the exemplary embodiments have been shown and described, it will be understood by those skilled in the art that various changes in form and details may be made thereto without departing from the spirit and scope of this disclosure as defined by the appended claims.

In addition, many modifications can be made to adapt a particular situation or material to the teachings of this disclosure without departing from the essential scope thereof. Therefore, it is intended that this disclosure not be limited to the particular exemplary embodiments disclosed as the best mode contemplated for carrying out this disclosure, but that this disclosure will include all embodiments falling within the scope of the appended claims.

What is claimed is:

1. A partial discharge detection sensor for measuring a partial discharge signal in gas-insulated equipment, the sensor comprising:
   a printed circuit board substrate;
   a partial discharge signal detection pattern formed on the printed circuit board substrate to detect a partial discharge signal in the gas-insulated equipment; and
   a connection terminal formed directly on the printed circuit board substrate for receiving the partial discharge signal detected by the partial discharge signal detection pattern and transmitting the partial discharge signal to a connector that outputs the partial discharge signal,
   wherein the connection terminal is directly connected to the connector.

2. The partial discharge detection sensor according to claim 1, further comprising a fixing unit for attaching the printed circuit board substrate to the gas insulated equipment.

3. The partial discharge detection sensor according to claim 1, wherein the printed circuit board substrate has a capacitance of 1 to 100 pF.

4. The partial discharge detection sensor according to claim 1, wherein the partial discharge detection sensor has a frequency band of 10 MHz to 1 GHz.

5. The partial discharge detection sensor according to claim 1, wherein the printed circuit board substrate has a plate shape.

6. The partial discharge detection sensor of claim 1, wherein the printed circuit board substrate is in direct contact with the connector.

7. A partial discharge detection device for detecting a partial discharge in a gas-insulated equipment, the device including an enclosure, an inner conductor located in the enclosure, and an insulating gas for insulating the enclosure and the inner conductor from each other, the device comprising:
   a partial discharge detection sensor including:
      a printed circuit board substrate,
      a partial discharge signal detection pattern formed on the printed circuit board substrate to detect a partial discharge signal in the gas-insulated equipment, and
      a connection terminal formed directly on the printed circuit board substrate for receiving the partial discharge signal detected by the partial discharge signal detection pattern; and
   a connector connected to the connection terminal of the partial discharge detection sensor to receive the partial discharge signal detected by the partial discharge detection sensor and output the partial discharge signal to the outside of the enclosure,
   wherein the partial discharge detection sensor is located in the enclosure, and the connection terminal is directly connected to the connector.

8. The partial discharge detection device according to claim 7, wherein the partial discharge detection sensor is attached to an inner wall of the enclosure.

9. The partial discharge detection device according to claim 8, wherein the connector and the partial discharge detection sensor are connected with each other via a through hole formed on the enclosure.

10. The partial discharge detection device according to claim 7, wherein the connector is attached to an outer wall of the enclosure.

11. The partial discharge detection device of claim 7, wherein the printed circuit board substrate is in direct contact with the connector and the enclosure.

* * * * *